US011068005B2

(12) United States Patent
Poon

(10) Patent No.: US 11,068,005 B2
(45) Date of Patent: Jul. 20, 2021

(54) POWER FACTOR CORRECTING METHOD

(71) Applicant: Murata Manufacturing Co., Ltd., Nagaokakyo (JP)

(72) Inventor: Hungpiu Poon, Hong Kong (CN)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/826,710

(22) Filed: Mar. 23, 2020

(65) Prior Publication Data

US 2020/0313546 A1 Oct. 1, 2020

(30) Foreign Application Priority Data

Mar. 29, 2019 (CN) .......................... 201910256425.1

(51) Int. Cl.
*G05F 1/70* (2006.01)
*H02M 1/42* (2007.01)
*H02M 1/00* (2006.01)

(52) U.S. Cl.
CPC ............ *G05F 1/70* (2013.01); *H02M 1/4208* (2013.01); *H02M 2001/0012* (2013.01)

(58) Field of Classification Search
CPC ................. G05F 1/70; H02M 1/4208; H02M 2001/0012
See application file for complete search history.

(56) References Cited

U.S. PATENT DOCUMENTS 8,872,484 B2   10/2014 Kim
2010/0156377 A1*  6/2010 Siegler ............... H02M 1/4225
                                                              323/284

(Continued)

OTHER PUBLICATIONS

Sun, "Increase power factor by digitally compensating for PFC EMI-capacitor reactive current", http://www.ti.com/lit/ani/slyt673/slyt673.pdf, Analog Applications Journal, 2016, 6 pages.

*Primary Examiner* — Jue Zhang
(74) *Attorney, Agent, or Firm* — Keating & Bennett, LLP

(57) ABSTRACT

A power factor correcting method for correcting a power factor in an alternating current power supply includes detecting zero-crossing points of an input voltage $V_{AC}$ of the AC power supply to obtain a period T of the input voltage $V_{AC}$; generating a half-wave symmetric periodic function f(t) by using the period T; implementing a recursive low-pass filter y(t) by using the half-wave symmetric periodic function f(t), so that an output of the recursive low-pass filter y(t) matches a target reactive current $I_{xcap}(t)$ flowing through an X-capacitor; generating a reference current $I'_{ref}(t)$ for correcting the power factor by using a given reference current $I_{ref}(t)$ and the recursive low-pass filter y(t); and correcting the power factor by using the reference current $I'_{ref}(t)$. Accordingly, the reactive current of the EMI capacitor can be compensated in a high code efficiency manner.

13 Claims, 5 Drawing Sheets

(56) References Cited

U.S. PATENT DOCUMENTS

2012/0025806 A1* 2/2012 Chui .................. G01R 19/2513
324/76.11
2014/0052394 A1* 2/2014 Sun ....................... G01R 35/04
702/61

* cited by examiner

POWER FACTOR CORRECTING METHOD

CROSS REFERENCE TO RELATED APPLICATIONS

This application claims the benefit of priority to Chinese Patent Application No. 201910256425.1 filed on Mar. 29, 2019. The entire contents of this application are hereby incorporated herein by reference.

BACKGROUND OF THE INVENTION

1. Field of the Invention

The present invention relates to a power factor correcting method, and in particular, to a power factor correcting method which corrects a power factor in an alternating current (AC) power supply.

2. Description of the Related Art

In a switching AC power supply, an electromagnetic interference (EMI) filter is generally used to suppress conductive noises generated by the switching AC power supply. Inside such a filter, an X-capacitor (X-cap) is connected to an input line and acts as a low-pass filter for differential noises. However, a relatively large capacitance value of such a capacitor may severely affect the performance of a power factor corrector (PFC) in the power supply, resulting in a bad current harmonic distortion and a poor power factor.

In the past, a conventional method of improving PFC was mainly focused on current loop tuning, and there was almost no further improvement with the usage of the X-cap. However, a poor power factor (PF) mainly occurs at a high line voltage and a light load. In this case, the X-cap has a great impact on PF.

Recently, a solution has been proposed to achieve X-cap reactive current compensation in a digitally controlled PFC. Increase power factor by digitally compensating for PFC EMI-capacitor reactive current, http://www.ti.com/lit/an/slyt673/slyt673.pdf describes a theory and implementation method of how to compensate for the X-cap reactive current. In the implementation method disclosed in Increase power factor by digitally compensating for PFC EMI-capacitor reactive current, http://www.ti.com/lit/an/slyt673/slyt673.pdf, a new reference current is obtained by subtracting the X-cap reactive current from a reference current, and the new reference current is applied to the PFC current loop. In order to calculate a reference current for the X-cap reactive current in a cosine waveform, an input voltage measurement result of an analog-digital converter (ADC) is stored in a random access memory (RAM).

However, the method disclosed Increase power factor by digitally compensating for PFC EMI-capacitor reactive current, http://www.ti.com/lit/an/slyt673/slyt673.pdf requires too much storage space in RAM to calculate the reference current for the X-cap reactive current. In addition, it usually takes a lot of time resources to perform calculations for each sampling period. This may result in a low code efficiency and an increase of cost of expensive high-performance microcontroller units (MCUs).

A similar method of delaying the PFC current has been proposed in U.S. Pat. No. 8,872,484, but a method of compensating for the X-cap current thereof is different from that of Increase power factor by digitally compensating for PFC EMI-capacitor reactive current, http://www.ti.com/lit/an/slyt673/slyt673.pdf. In the method of U.S. Pat. No. 8,872,484, second harmonics are actually obtained from an output power, and then the second harmonic components are injected into a voltage control of the PFC, so that the power supply can change a leading power factor into a lagging power factor. However, a second harmonic frequency used for compensation is not exactly an X-cap current waveform, because the X-cap current has a sine frequency that is the same as a line frequency but advances 90 degrees in phase, which is actually roughly a composite input current. In addition, the X-cap current should be irrelevant to the output power. In U.S. Pat. No. 8,872,484B2, the compensation amplitude becomes relatively high, which causes a non-sine input current when the power supply is at a relatively high load.

SUMMARY OF THE INVENTION

Preferred embodiments of the present invention provide methods for power factor correction that are each able to effectively compensate for a reactive current of an EMI capacitor, thus improving a power factor and reducing a current harmonic distortion. Accordingly, compared with the existing methods, code efficiency is improved, and a microcontroller is able to generate a continuous reactive current of the EMI capacitor with less computing resources.

According to a preferred embodiment of the present invention, a power factor correcting method for correcting a power factor of an AC power supply includes detecting zero-crossing points of an input voltage $V_{AC}$ of the AC power supply to obtain a period T of the $V_{AC}$; generating a half-wave symmetric periodic function f(t) by using the period T; implementing a recursive low-pass filter y(t) by using the half-wave symmetric periodic function f(t), so that an output of the recursive low-pass filter y(t) matches a target reactive current $I_{xcap}(t)$ flowing through an X-capacitor; generating a reference current $I'_{ref}(t)$ to correct the power factor by using a given reference current $I_{ref}(t)$ and the recursive low-pass filter y(t); and correcting the power factor by using the reference current $I'_{ref}(t)$.

In a preferred embodiment of the present invention, in order to compensate for the reactive current of the EMI capacitor in a high code efficiency manner, a simple half-wave symmetric function is generated digitally by the MCU and then a recursive low-pass filter is used to match the reactive current of the EMI capacitor, thus obtaining a new reference current for a power factor corrector.

According to preferred embodiments of the present invention, the reactive current of the EMI capacitor is able to be effectively compensated, thus improving the power factor and reducing the current harmonic distortion, and compared with the existing methods, the code efficiency is improved, and the microcontroller is able to generate a continuous reactive current of the EMI capacitor with less computing resources.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In order to facilitate understanding of the present invention, before describing preferred embodiments of the present invention, an existing active PFC will be described first.

Figure 1:
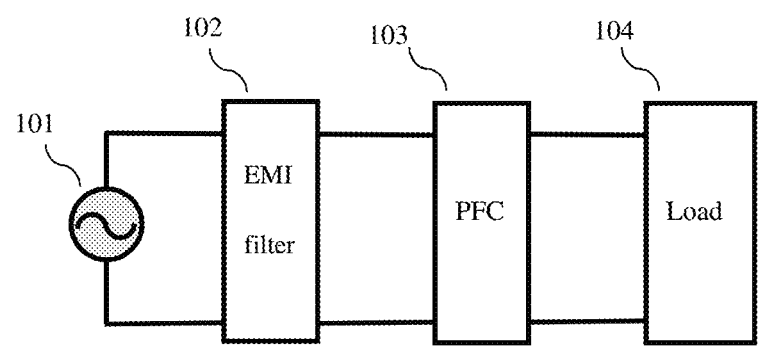
FIG. 1 illustrates a schematic diagram of a power factor correcting configuration according to the prior art.

FIG. 1 illustrates a schematic diagram of a power factor correcting configuration according to the prior art. In FIG. 1, 101 denotes an alternating current power supply (AC power supply) that supplies power to the PFC, 102 denotes an EMI filter that reduces or prevents conductive noises (including common mode and differential mode), 103 denotes a PFC circuit, which changes a waveform of the current supplied to a load to increase the power factor, and 104 denotes a load corresponding to an output of the PFC. Further, a rectifier circuit is provided inside the PFC circuit 103.

Figure 2:
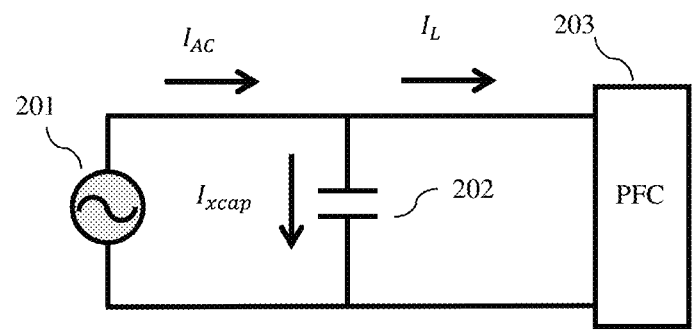
FIG. 2 schematically illustrates an equivalent circuit diagram of main portions of a power supply including an X-cap.

FIG. 2 schematically illustrates an equivalent circuit diagram of main portions of a power supply including an X-cap. A simplified EMI filter is shown in FIG. 2. An equivalent circuit of a differential input of the PFC is similar to a capacitor 202 before the PFC 203, because the common mode choke is not affected. In the circuit illustrated in FIG. 2, the current has a relationship shown in Equation 1 below:

$$I_{AC} = I_{xcap} + I_L \quad \text{[Equation 1]}$$

wherein $I_{AC}$ denotes a current provided by AC power supply 201, $I_{xcap}$ denotes a reactive current flowing through the X-cap, and $I_L$ denotes a current flowing through the PFC.

Generally, in the digitally controlled PFC, based on current loop control, $I_L$ should follow a reference current $I_{ref}$ generated by Equation 2 below:

$$I_{ref} = A \times B \times C \quad \text{[Equation 2]}$$

wherein A denotes a loop output voltage that changes with the load, B denotes $$\frac{1}{(RMS[V_{AC}])^2},$$

and C denotes an instantaneous input voltage, that is, $C = V_{AC}(t)$. $I_{ref}$ denotes a function that changes over time.

Accordingly, $I_L$ is in phase with $V_{AC}$.

In additional, $I_{xcap}$ may be calculated using Equation 3 below:

$$I_{xcap} = C_{xcap} \times \frac{d}{dt} V_{AC}(t) \quad \text{[Equation 3]}$$

wherein, $C_{xcap}$ denotes a capacitance of the X-cap, $$\frac{d}{dt}$$

denotes a time derivative, and $V_{AC}(t)$ denotes an instantaneous input voltage.

Figure 3:
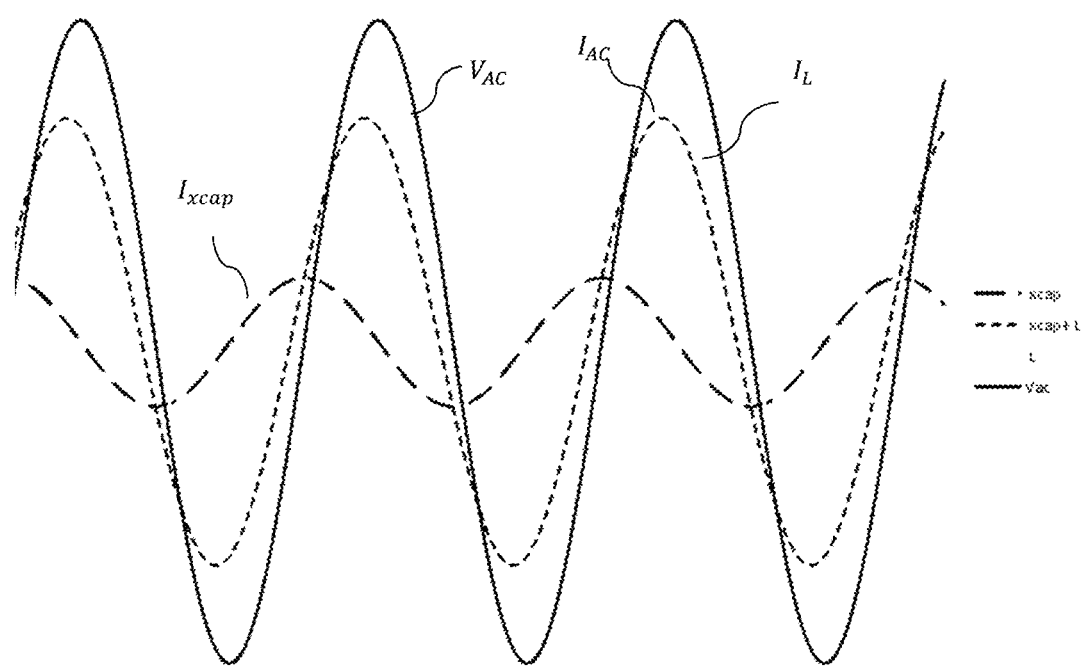
FIG. 3 illustrates a schematic diagram of a composite input waveform without X-cap compensation.

FIG. 3 illustrates a schematic diagram of a composite input waveform without X-cap compensation. As illustrated in FIG. 3, $I_{AC}$ is ahead of $V_{AC}$ due to the effect of $I_{xcap}$, which would result in a poor power factor calculated by Equation 4 below:

$$\text{Power factor} = \frac{\cos\theta}{\sqrt{1 + iTHD^2}} \quad \text{[Equation 4]}$$

wherein, $\cos\theta$ denotes a phase shift power factor, $$\frac{1}{\sqrt{1 + iTHD^2}}$$

denotes a distortion power factor, and iTHD denotes a total harmonic distortion of the load current.

In order to enable $I_{AC}$ to be in phase with the voltage input $V_{AC}$ of the AC power supply, $I_L$ may be modified to achieve a unit power factor. As mentioned above, a PFC current $I'_L$ compensated with X-cap should follow a reference current $I'_{ref}$ generated by Equation 5 below:

$$I'_{ref}(t) = I_{ref}(t) - I_{xcap}(t) \quad \text{[Equation 5]}$$

wherein $I'_{ref}(t)$ denotes a new reference current that changes over time, and $I_{xcap}(t)$ denotes a reactive current flowing through the X-cap calculated by the microcontroller using Equation 3.

Figure 4:
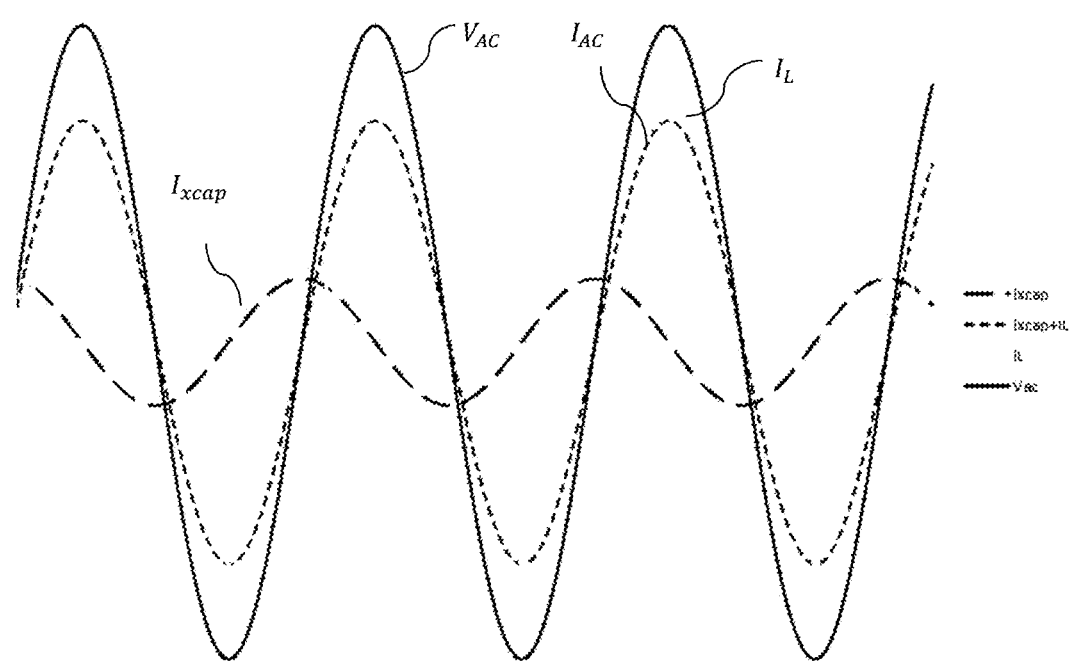
FIG. 4 illustrates a schematic diagram of a composite input waveform with X-cap compensation.

FIG. 4 illustrates a schematic diagram of a composite input waveform with X-cap compensation. The results after performing the X-cap compensation are illustrated in FIG. 4. As illustrated in FIG. 4, composite $I_{AC}$ is in phase with $V_{AC}$ and a power factor is close to 1.

Thus, it can be determined from the above that a key factor to implement the X-cap compensation is to generate, within the microcontroller, a reactive current flowing through the X-cap, that is, $I_{xcap}(t)$. Certainly, the reactive current $I_{xcap}(t)$ may also be detected by an isolated current meter, such as a Hall effect sensor, for example. In the present preferred embodiment, however, the reactive current $I_{xcap}(t)$ is preferably obtained by an algorithm in the microcontroller.

In this regard, in Increase power factor by digitally compensating for PFC EMI-capacitor reactive current, http://www.ti.com/lit/an/slyt673/slyt673.pdf, it is proposed to use an internal random access memory (RAM) to continuously record $V_{AC}$ to obtain $\cos(2\pi ft)$. However, in the method disclosed in Increase power factor by digitally compensating for PFC EMI-capacitor reactive current, http://www.ti.com/lit/an/slyt673/slyt673.pdf, a large amount of RAM storage space is occupied, and it is proportional to a sampling rate in a half period of $V_{AC}$. Moreover, if a line frequency is a time-varying variable, then it can be determined from Equation 6 below that:

$$I_{xcap}(t) = 2\pi f V_{AC} \cos(2\pi ft) \quad \text{[Equation 6]}$$

because the line frequency f is a variable, a periodic time between $V_{AC}$ zero-crossing points must be obtained, and then f is calculated from $$f = \frac{1}{\text{periodic time}},$$

the division calculation of which would take a long time in the microcontroller unit, so the microcontroller unit needs to use considerable computing resources to calculate $I_{xcap}(t)$.

To this end, the inventor of preferred embodiments of the present invention, after research, has developed a new power factor correcting method. By using the methods according to preferred embodiments of the present invention to calculate the reference current, the reactive current of the EMI capacitor can be effectively compensated, and accordingly, the power factor can be improved and the current harmonic distortion can be reduced, and compared with the existing methods, code efficiency can be increased, and the microcontroller can generate a continuous reactive current of the EMI capacitor with less computing resources.

The technical ideas and preferred embodiments of the present invention will be specifically described below.

Power factor correcting methods according to preferred embodiments of the present invention are described below. By applying the power factor correcting methods according to preferred embodiments of the present invention to a reference current calculation to compensate for the reactive current of an EMI capacitor, the power factor of a switching AC power supply can be improved, and the current harmonic distortion can be reduced.

Figure 5:
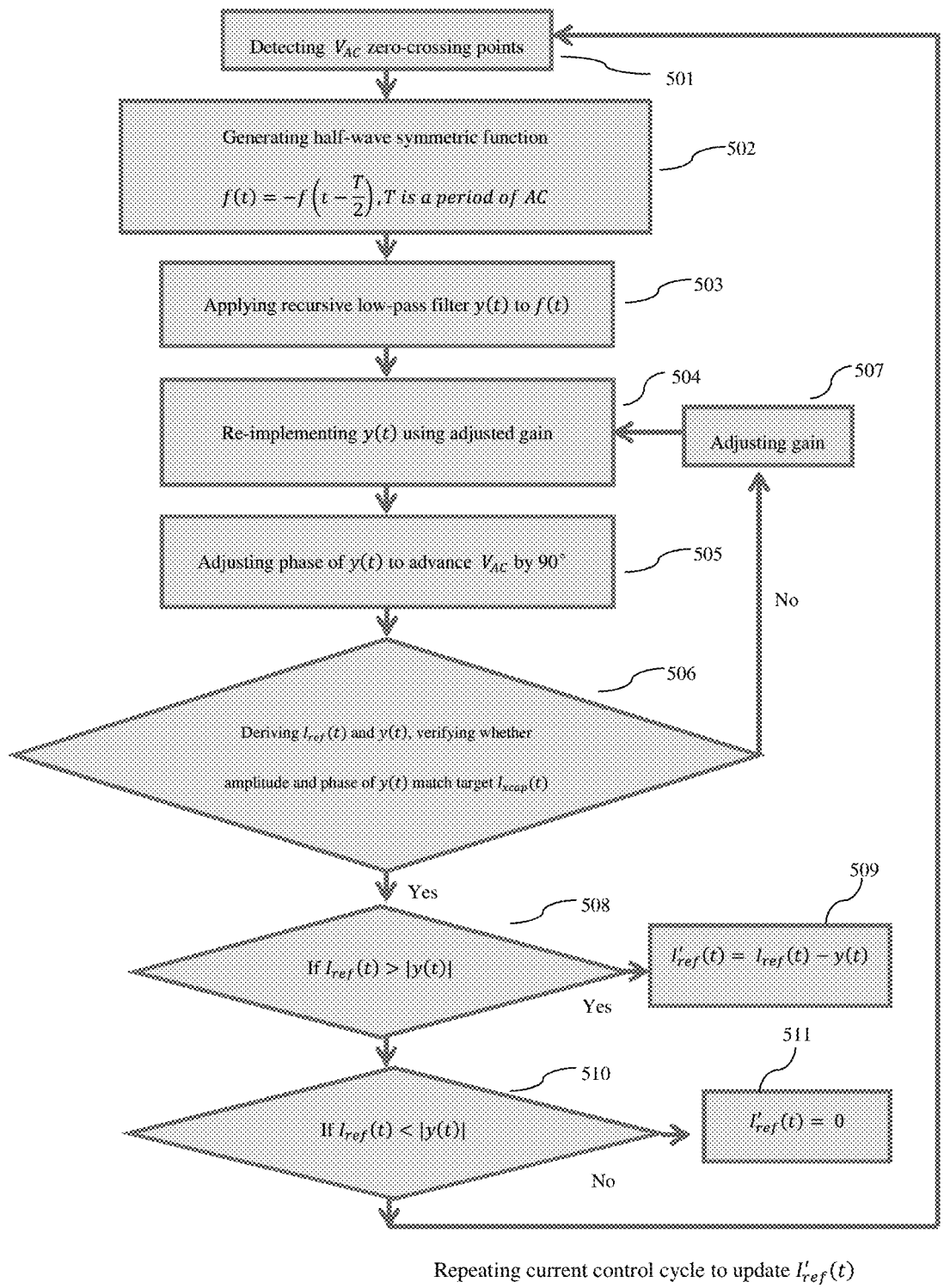
FIG. 5 illustrates a flowchart of generating a new reference current using X-cap compensation according to a preferred embodiment of the present invention.

FIG. 5 illustrates a flowchart of generating a new reference current using X-cap compensation according to a preferred embodiment of the present invention.

In order to facilitate understanding of the present preferred embodiment and avoid repetitive descriptions, a portion of a current loop control flow is illustrated in FIG. 5, in which the calculation of $I_{ref}$ using Equation 2 is skipped. An output of the flowchart as illustrated in FIG. 5 is a new reference current $I'_{ref}$, which is periodically updated after $I_{ref}$.

As illustrated in FIG. 5, in Step 501, $V_{AC}$ zero-crossing points are digitally detected from a AC power supply (referring to the AC power supply 101 of the circuit illustrated in FIG. 1 and the AC power supply 201 of the circuit illustrated in FIG. 2), to obtain a period of $V_{AC}$ and set the period of $V_{AC}$ to T. In Step 502, the period T is used to generate a periodic function with half-wave symmetry, that is, a half-wave symmetric function $f(t)$. Any type of periodic function may be generated in Step 502, as long as it has half-wave symmetry, such as, for example, square wave, triangular wave, trapezoidal wave, etc. The simpler the function is, the higher the code efficiency can be. For example, in the present preferred embodiment, the half-wave symmetric function $f(t)$ may be generated using Equation 7 below, and the period of the half-wave symmetric function generated in the present preferred embodiment is equal to the period of $V_{AC}$:

$$f(t) = -f\left(t - \frac{T}{2}\right) \qquad \text{[Equation 7]}$$

wherein T denotes the period of $V_{AC}$.

In Step 503, a recursive filter $y(t)$ is applied to the half-wave symmetric function $f(t)$ to generate an approximately sine waveform. In the present preferred embodiment, the recursive filter $y(t)$ is preferably a low-pass filter, for example. That is, the recursive low-pass filter $y(t)$ is implemented using the half-wave symmetric function $f(t)$. It should be noted that $y(t)$ can be any type of recursive filter using one or more outputs as input. For example, Equation 9 as described in the following may be used to obtain the recursive filter $y(t)$, by a simple replacement of $\tau(t)$ in Equation 9 with $f(t)$. The characteristic of the recursive filter $y(t)$ is to smooth the periodic function generated in Step 502 and is preferably capable of significantly attenuating relatively high frequency components after many $V_{AC}$ periods. In the present preferred embodiment, the obtained recursive filter $y(t)$ can be represented as a sine wave with a baseline frequency, which looks like a reactive current $I_{xcap}$ flowing through the X-cap, but may have different amplitudes and phase shifts.

When the amplitude and phase of the obtained recursive filter $y(t)$ do not match the target $I_{xcap}$, a complex mathematical method may be used to calculate a gain and phase shift to adjust the amplitude and phase of $y(t)$ so as to match the amplitude and phase shift of $I_{xcap}$.

However, in the present preferred embodiment, steps 504, 505, 506, and 507 in FIG. 5 are used to provide a preferred and simpler iterative method to adjust the amplitude and phase shift of $y(t)$.

In the present preferred embodiment, in order to monitor $y(t)$ and $I_{ref}$ in Step 506, the microcontroller unit MCU may derive $y(t)$, as well as $I_{ref}(t)$ which is calculated from the voltage of the AC power supply and the loop output voltage using the above Equation 2, and verify whether the amplitude and phase of $y(t)$ match the target $I_{xcap}(t)$ calculated using the above Equation 3. If it is No in Step 506, then in Step 507, a gain is adjusted, and in Step 504, the adjusted gain is used as a multiplication coefficient to compensate for $y(t)$ to adjust the amplitude of $y(t)$. In Step 505, the phase of $y(t)$ is adjusted to advance $V_{AC}$ by a given threshold. The amplitude and phase of $y(t)$ can be approximately consistent with the target $I_{xcap}(t)$ through several iterations. The given threshold is preferably, for example, in a range of about 85 degrees to about 95 degrees, and more preferably is about 90 degrees.

Similar to the prior art using Equation 5 as described above, in the present preferred embodiment, a new reference current $I'_{ref}(t)$ may be obtained through steps 508, 509, 510, and 511 shown in FIG. 5. Specifically, in Step 508, it is determined whether the target $I_{ref}(t)$ is greater than the absolute value of $y(t)$. In this example, the comparison may be performed using the values of the target $I_{ref}(t)$ and $y(t)$ at a current time point. If it is YES in Step 508, then as shown in Step 509, the reference current $I'_{ref}(t)=I_{ref}(t)-y(t)$ is set, wherein $I_{ref}(t)$ is calculated by the microcontroller unit MCU in Step 506. If it is NO in Step 508, then it is determined in Step 510 whether the target $I_{ref}(t)$ is less than an absolute value of $y(t)$. If it is NO in Step 510, then as shown in Step 511, the reference current $I'_{ref}(t)=0$ is set. If it is YES in Step 510, then the current control cycle is repeated to update $I'_{ref}(t)$.

Further, after optimizing the gain and phase shift to obtain a proper power factor and lower current harmonic distortion (iTHD), steps 504, 505, 506, and 507 in FIG. 5 may be omitted.

In addition, in order to support an entire range of the AC input, several sets of gains and phase shifts may be applied discretely based on the line frequency and amplitude (e.g., about 230 Vac at 50 Hz or about 110 AC at 60 Hz).

Further, in the preferred embodiments of the present invention, the half-wave symmetric periodic function $f(t)$ may include, for example, but not limited to, a square wave, a triangular wave, a trapezoidal wave, or the like. The digital low-pass filter y(t) may include, for example, but not limited to, a recursive or non-recursive filter.

Next, a specific preferred embodiment of the present invention will be described.

Figure 6:
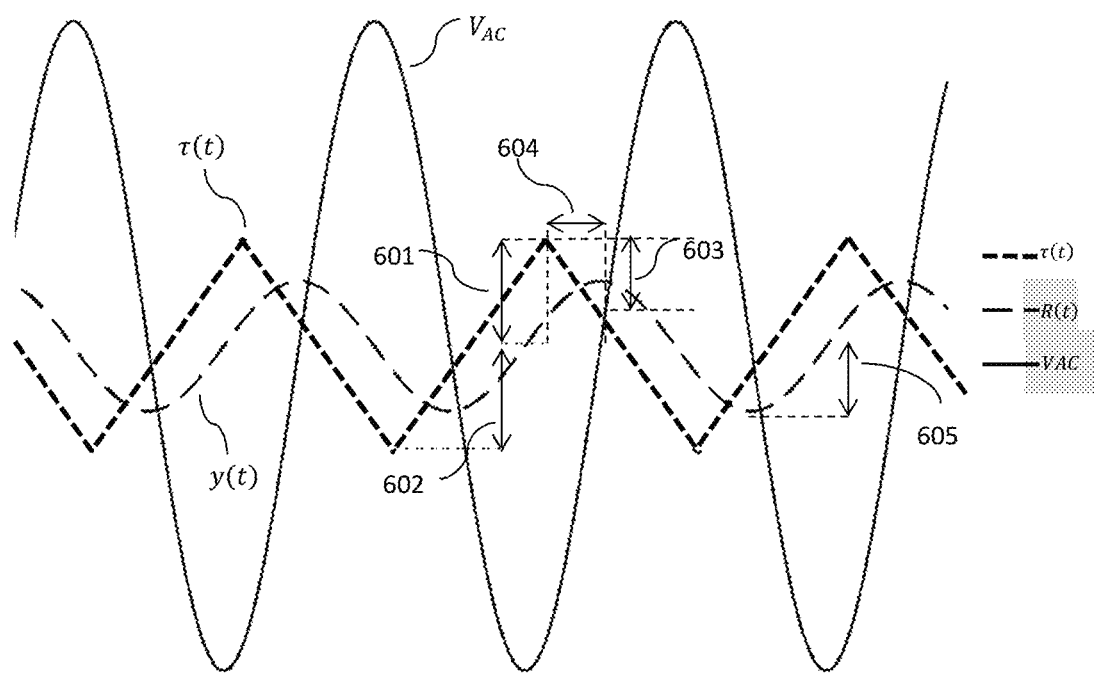
FIG. 6 schematically illustrates a diagram of a detailed graphical description of X-cap compensation according to a preferred embodiment of the present invention.

FIG. 6 schematically illustrates a diagram of a detailed graphical description of X-cap compensation according to a preferred embodiment of the present invention. In the present preferred embodiment, a triangular wave $\tau(t)$ is generated as an example of the half-wave symmetric periodic function $f(t)$ in the above-described preferred embodiments. For a mathematical expression of the triangular wave $\tau(t)$, it may be expressed as a trigonometric function $\tau(t)$ as shown in Equation 8 below:

$$\tau(t) = 2\left|2\left(\frac{t}{p} - \text{floor}\left(\frac{t}{p} + \frac{1}{2}\right)\right)\right| - 1 \qquad \text{[Equation 8]}$$

wherein $\tau(t)$ is in a range from $-1$ to $+1$. p is a periodic time of a period preceding $V_{AC}$ and is reset and updated at the end of the $V_{AC}$ period.

In the present preferred embodiment, in order to use the microcontroller unit MCU more conveniently, the same input and output as those in Equation 8 are used to generate a triangular wave.

First, zero-crossing points of $V_{AC}$ are detected to obtain the period of $V_{AC}$. To adjust the phase, an instantaneous value of the trigonometric function $\tau(t)$ is reset to $$\frac{p}{4} - s,$$

wherein p is the periodic duration of a preceding period, which is reset and updated at the end of the $V_{AC}$ period, and s is a given phase shift, which is shown by the symbol 603 in FIG. 6. An upper limit (shown by the symbol 601 in FIG. 6) of the value of the trigonometric function $\tau(t)$ is set to $$\frac{p}{4}.$$

A lower limit (shown by the symbol 602 in FIG. 6) of the value of the trigonometric function $\tau(t)$ is set to $$\left(\text{the upper limit} - \frac{p}{2}\right).$$

If a triangular wave at the current time is towards the lower limit, then $$\tau(t) = \frac{p}{4} - s - t,$$

wherein $$0 \le t < \frac{p}{2} - s;$$

if the lower limit is reached, then $$\tau(t) = s - \frac{3p}{4} + t,$$

wherein $$\frac{p}{2} - s \le t < p - s;$$

if the upper limit is reached, then $$\tau(t) = \frac{5p}{4} - s - t,$$

wherein $p - s \ge t < p$. Thus, a triangular wave is generated.

Next, in the present preferred embodiment, a simple recursive low-pass filter R(t) can be obtained using Equation 9 below. R(t) is an example of y(t) in the present preferred embodiment:

$$R(t) = \frac{(2^n - 1)R(t-1) + A \cdot \tau(t)}{2^n} \qquad \text{[Equation 9]}$$

wherein n is a natural number and A is a given gain.

In the present preferred embodiment, R(t) may be any type of digital recursive low-pass filter, which corresponds to y(t) in the present preferred embodiment.

Next, the obtained recursive low-pass filter R(t) is applied to $\tau(t)$. If $I_{ref}(t) > |R(t)|$, then $I'_{ref}(t) = I_{ref}(t) - R(t)$; and if $I_{ref}(t) < |R(t)|$, then $I'_{ref}(t) = 0$.

$I_{ref}(t)$ and R(t) are derived to verify whether R(t) matches the amplitude and phase of the calculated target $I_{xcap}(t)$.

After several iterations, an appropriate amplitude (shown by the symbol 605 in FIG. 6), phase (shown by the symbol 604 in FIG. 6), and n in Equation 9 can be obtained. In the present preferred embodiment, R(t) should be close to the calculated target $I_{xcap}(t)$.

If a preferred embodiment of the present invention is applied to a 1600 watt AC-DC power supply unit of a 230 Vac, 50 Hz line, then result measurements of iTHD and power factor may be shown in Table 1 below.

TABLE 1

| Load ratio | Before | | After | |
|---|---|---|---|---|
| | iTHD | Power factor | iTHD | Power factor |
| 10 | 15.6 | 0.86 | 8.5 | 0.991 |
| 20 | 9.3 | 0.93 | 7.1 | 0.992 |
| 50 | 5.7 | 0.97 | 4.4 | 0.997 |
| 100 | 4.2 | 0.98 | 3.5 | 0.999 |

Table 1 shows results before and after implementing a preferred embodiment of the present invention at different percentages of full load. It can be seen from Table 1 that significant improvements can be obtained after the implementation of the preferred embodiment, especially at light loads, since the X-cap current is dominant.

By applying preferred embodiments of the present invention, compared with the prior art methods, iTHD and power factor can be improved equivalently to or better than the prior art. In addition, compared with the prior art methods, which require more RAM and computing resources, a method according to a preferred embodiment of the present invention can improve code efficiency, and can compensate for the reactive current of the EMI capacitor by the microcontroller unit MCU with less computing resources. For example, if 2000 updates occur in one AC period, then compared with the prior art methods, the method according to a preferred embodiment can save about 90% of RAM and 80% of computing time, for example.

In addition, the algorithm in the above-described preferred embodiment can be implemented by, for example, but not limited to, a microcontroller unit MCU, a digital signal processor, a processor, an object, an executable program, an execution thread, a program, and/or a computer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power factor correcting method for correcting a power factor of an alternating current (AC) power supply, comprising:
    detecting zero-crossing points of an input voltage $V_{AC}$ of the AC power supply to obtain a period T of the input voltage $V_{AC}$;
    generating a half-wave symmetric periodic function f(t) by using the period T;
    implementing a recursive low-pass filter y(t) by using the half-wave symmetric periodic function f(t), so that an output of the recursive low-pass filter y(t) matches a target reactive current $I_{xcap}(t)$ flowing through an X-capacitor;
    generating a reference current $I'_{ref}(t)$ to correct the power factor by using a given reference current $I_{ref}(t)$ and the recursive low-pass filter y(t); and
    correcting the power factor by using the reference current $I'_{ref}(t)$.

2. The power factor correcting method according to claim 1, wherein an output of the half-wave symmetric periodic function f(t) is a square wave, a triangular wave or a trapezoidal wave.

3. The power factor correcting method according to claim 1, wherein the half-wave symmetric periodic function f(t) is generated using the following equation:

$$f(t) = -f\left(t - \frac{T}{2}\right).$$

4. The power factor correcting method according to claim 1, wherein the half-wave symmetric periodic function f(t) is generated using the following equation:

$$f(t) = 2\left|2\left(\frac{t}{p} - \text{floor}\left(\frac{t}{p} + \frac{1}{2}\right)\right)\right| - 1,$$

wherein p is a periodic time of a period preceding the period T.

5. The power factor correcting method according to claim 1, wherein an amplitude and a phase of the recursive low-pass filter y(t) match the target reactive current $I_{xcap}(t)$.

6. The power factor correcting method according to claim 1, further comprising adjusting an amplitude and a phase of the recursive low-pass filter y(t), so that the amplitude and the phase of the recursive low-pass filter y(t) match the target reactive current $I_{xcap}(t)$.

7. The power factor correcting method according to claim 6, wherein the adjusting the amplitude and the phase of the recursive low-pass filter y(t), so that the amplitude and the phase of the recursive low-pass filter y(t) match the target reactive current $I_{xcap}(t)$ comprises:
    adjusting a gain;
    re-implementing the recursive low-pass filter y(t) by using the adjusted gain and the f(t);
    adjusting the phase of the recursive low-pass filter y(t) to advance the input voltage $V_{AC}$ by a given threshold; and
    determining whether the amplitude and the phase of the recursive low-pass filter y(t) match the target reactive current $I_{xcap}(t)$.

8. The power factor correcting method according to claim 7, wherein the given threshold is in a range of about 85 degrees to about 95 degrees.

9. The power factor correcting method according to claim 7, wherein the given threshold is about 90 degrees.

10. The power factor correcting method according to claim 1, wherein the recursive low-pass filter y(t) is implemented by the following equation:

$$y(t) = \frac{(2^n - 1)y(t-1) + A \cdot f(t)}{2^n},$$

wherein n is a natural number and A is a given gain.

11. The power factor correcting method according to claim 1, wherein the target reactive current $I_{xcap}(t)$ is calculated by the following equation:

$$I_{xcap} = C_{xcap} \times \frac{d}{dt} V_{AC}(t),$$

wherein $C_{xcap}$ is a capacitance of the X-capacitor, $$\frac{d}{dt}$$

is a time derivative, and $V_{AC}(t)$ is an instantaneous input voltage of the AC power supply.

12. The power factor correcting method according to claim 1, wherein
    when the given reference current $I_{ref}(t)$ is greater than an absolute value of the recursive low-pass filter y(t), the reference current $I'_{ref}(t)$ satisfies $I'_{ref}(t)=I_{ref}(t)-y(t)$; and
    when the given reference current $I_{ref}(t)$ is equal to the absolute value of the recursive low-pass filter y(t), the reference current $I'_{ref}(t)$ is equals to zero.

13. The power factor correcting method according to claim 1, wherein the given reference current $I_{ref}(t)$ is calculated based on a loop output voltage, $$\frac{1}{(\text{RMS}[V_{AC}])^2}$$

and an instantaneous input voltage $V_{AC}(t)$ of the AC power supply.

* * * * *